United States Patent
Hashimoto et al.

(10) Patent No.: US 9,130,554 B2
(45) Date of Patent: Sep. 8, 2015

(54) HIGH-FREQUENCY POWER SOURCE DEVICE

(75) Inventors: Takashi Hashimoto, Tokyo (JP); Junichi Shibata, Tokyo (JP); Yoshikazu Ukai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/116,900

(22) PCT Filed: May 21, 2012

(86) PCT No.: PCT/JP2012/062956
§ 371 (c)(1),
(2), (4) Date: Nov. 11, 2013

(87) PCT Pub. No.: WO2012/169337
PCT Pub. Date: Dec. 13, 2012

(65) Prior Publication Data
US 2014/0097909 A1    Apr. 10, 2014

(30) Foreign Application Priority Data
Jun. 6, 2011   (JP) .................................. 2011-126581

(51) Int. Cl.
*H03K 3/354* (2006.01)
*B23H 1/02* (2006.01)

(52) U.S. Cl.
CPC ................ *H03K 3/354* (2013.01); *B23H 1/022* (2013.01); *B23H 2300/20* (2013.01); *B23H 2300/22* (2013.01)

(58) Field of Classification Search
USPC ............................................ 219/69.13, 69.18
See application file for complete search history.

(56) References Cited

U.S. PATENT DOCUMENTS

| 5,585,014 A | 12/1996 | Magara |
| 2011/0163071 A1* | 7/2011 | Hashimoto et al. ........ 219/69.13 |

FOREIGN PATENT DOCUMENTS

| CN | 1101869 A | 4/1995 |
| CN | 1063697 C | 3/2001 |
| CN | 101932403 A | 12/2010 |
| JP | 59 059319 | 4/1984 |
| JP | 01 240223 | 9/1989 |

(Continued)

OTHER PUBLICATIONS

International Search Report Issued Aug. 21, 2012 in PCT/JP12/062956 Filed May 21, 2012.

(Continued)

*Primary Examiner* — Joseph Chang
(74) *Attorney, Agent, or Firm* — Oblon, McClelland, Maier & Neustadt, L.L.P.

(57) ABSTRACT

A high-frequency power source device includes switching element groups having a configuration in which a plurality of switching elements turned on/off cyclically are connected in parallel. One parallel connection terminal of the switching element group is connected to a positive electrode terminal of a DC power source, and one parallel connection terminal of the switching element group is connected to a negative electrode terminal of the DC power source. Respective other parallel connection terminals of the switching element groups are connected via a reactor. A pulse voltage that appears at opposite ends of the reactor due to a cyclic on/off operation of the switching element groups is applied to a load through a coaxial cable and a matching circuit.

4 Claims, 6 Drawing Sheets

(56) References Cited

FOREIGN PATENT DOCUMENTS

| | | |
|---|---|---|
| JP | 07 009258 | 1/1995 |
| JP | 2004-7132 | 1/2004 |
| JP | 2004 039853 | 2/2004 |
| JP | 2006 321007 | 11/2006 |
| WO | WO 2010/026790 A1 | 3/2010 |

OTHER PUBLICATIONS

Combined Office Action and Search Report issued Feb. 3, 2015 in Chinese Patent Application No. 201280027319.2 (with partial English-language translation).

* cited by examiner

HIGH-FREQUENCY POWER SOURCE DEVICE

FIELD

The present invention relates to a high-frequency power source device that generates a high frequency pulse, and more particularly to a high-frequency power source device that applies a high frequency pulse to a load that fluctuates non-linearly, for example, to an electric-discharge machining device.

BACKGROUND

An electric-discharge machining device performs machining with respect to a workpiece by generating arc discharge in an electrode gap between a machining electrode and the workpiece. As a configuration of the electric-discharge machining device, there have been various types conventionally, with regard to a configuration of a machining power source used for generating arc discharge in the electrode gap.

Particularly, because a machining surface can be ultrafinely finished by applying a high frequency pulse to the electrode gap, a high-frequency power source device that generates a high frequency pulse has been used for a finish-machining power source, and various configuration examples have been proposed (for example, Patent Literatures 1, 2, and 3).

Patent Literature 1 describes an example of a discharge-machining power source device that applies a predetermined pulse voltage to an electrode gap between a workpiece and an electric-discharge machining electrode. The discharge-machining power source device includes a power source, a switching unit that on-off operates in a preset cycle, and an inductance element that is serially connected to the power source and the switching unit. Opposite ends of the inductance elements are electrically connected to the workpiece and the electric-discharge machining electrode. When the switching unit is turned on, because the inductance element is connected to the power source, energy is accumulated in the inductance element. When the switching unit is turned off, energy accumulated in the inductance element is supplied to the electrode gap based on a counter-induced electromotive force.

Particularly, the switching unit is formed of a switch group in which a plurality of switching units are arranged in parallel, and can reduce a load per switching element per unit time by on-off operating each switching unit in the switch group cyclically such as A→B→C→A→B . . . .

Patent Literatures 2 and 3 disclose a configuration example of a fine machining power source using a high-frequency AC power source. That is, in Patent Literature 2, a high-frequency AC power source and a work tank are connected to each other by a coaxial cable, and a matching box for matching an impedance is provided between a characteristic impedance and the work tank.

Patent Literature 3 discloses a configuration including a rough machining cable for connecting a rough-machining power source to a work tank, in addition to a finish machining cable for connecting a fine-machining power source to the work tank, and a matching circuit for adjusting the impedance in an electrode gap. Patent Literature 3 explains that a finely machined surface can be obtained by adjusting the impedance without detaching the rough machining cable.

CITATION LIST

Patent Literatures

Patent Literature 1: Japanese Patent Application Laid-open No. 2006-321007
Patent Literature 2: Japanese Patent Application Laid-open No. H1-240223
Patent Literature 3: Japanese Patent Application Laid-open No. H7-009258

SUMMARY

Technical Problem

As in Patent Literature 1, in a case where a plurality of switching units are arranged in parallel and turned on/off cyclically, floating inductance and floating conductance are present between the respective switching units. Even when a common inductance element is connected to an output destination of these switching units, when there is a variation in these floating inductance and floating conductance, a disturbance is likely to occur in an output waveform.

Alternatively, when there is a variation in the switching speed of the switching unit or in on-resistance, if the switching units are turned on/off cyclically, a waveform having a disturbed crest value is output.

In Patent Literatures 2 and 3, a high-frequency AC power source is used. Because the high-frequency AC power source generally uses a crystal oscillator, an amplifier at a first stage gradually amplifies and outputs a sine wave, while substantially maintaining the shape of the sine wave. Therefore, there is no variation in the waveform caused by the variation in the switching units as in Patent Literature 1. However, an output waveform thereof depends on an oscillation frequency of the crystal oscillator, and there is a restriction such that a specific frequency or a specific duty ratio is fixed.

The present invention has been achieved to solve the above problems, and an object of the present invention is to provide a high-frequency power source device that can obtain a stable voltage pulse output even if a load fluctuates non-linearly, when a plurality of switching units are arranged in parallel and turned on/off cyclically.

Solution to Problem

In order to solve the above problem and in order to attain the above object, a high-frequency power source device of the present invention includes: a DC power source; a switching element group in which a plurality of switching elements that are turned on/off cyclically are connected in parallel, and one parallel connection terminal thereof is connected to one electrode terminal of the DC power source; a first inductance element that connects the other parallel connection terminal of the switching element group and the other electrode terminal of the DC power source to each other; and a matching circuit provided in a path for supplying a pulse voltage that appears at opposite ends of the first inductance element to a load.

Advantageous Effects of Invention

According to the present invention, when parallel-connected switching elements are turned on/off cyclically to supply energy to a common inductance element and supply accumulated energy (a high frequency pulse) sequentially to a load, a matching circuit provided in supply path shapes a pulse having a different waveform for each switching element so that the pulse has a similar waveform. Accordingly, even if there is a variation in the switching elements, there is no fluctuation in a crest value, and even if the load fluctuates, there is less reflection. Therefore, a high-frequency power source device having a stable output characteristic can be achieved. Particularly, when an electric-discharge machining device is used as a load, an electric-discharge machining characteristic that forms a stable fine machining surface can be achieved.

DESCRIPTION OF EMBODIMENTS

Exemplary embodiments of a high-frequency power source device according to the present invention will be explained below in detail with reference to the accompanying drawings. The present invention is not limited to the embodiments.

First Embodiment

Figure 1:
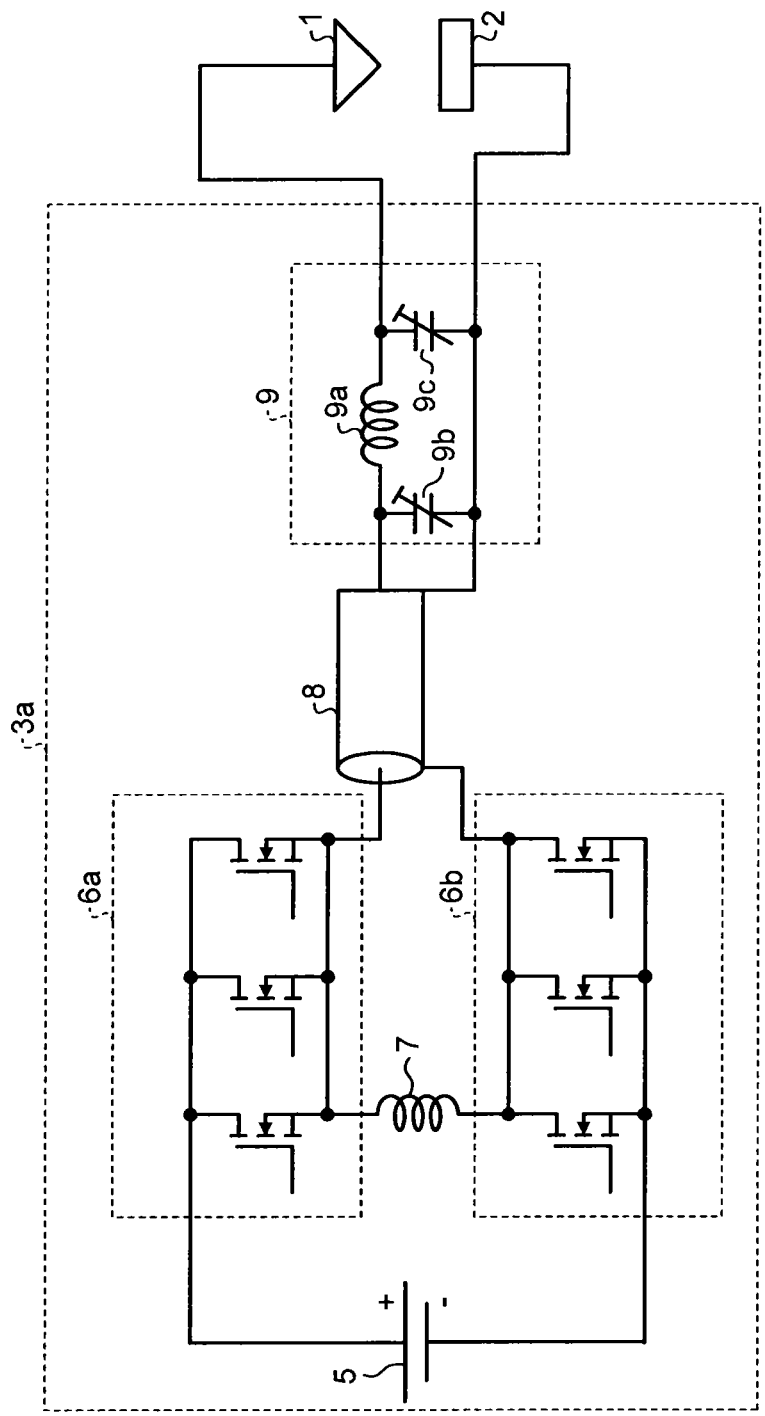
FIG. 1 is a circuit diagram of a configuration of a high-frequency power source device according to a first embodiment of the present invention.

FIG. 1 is a circuit diagram of a configuration of a high-frequency power source device according to a first embodiment of the present invention.

Figure 2:
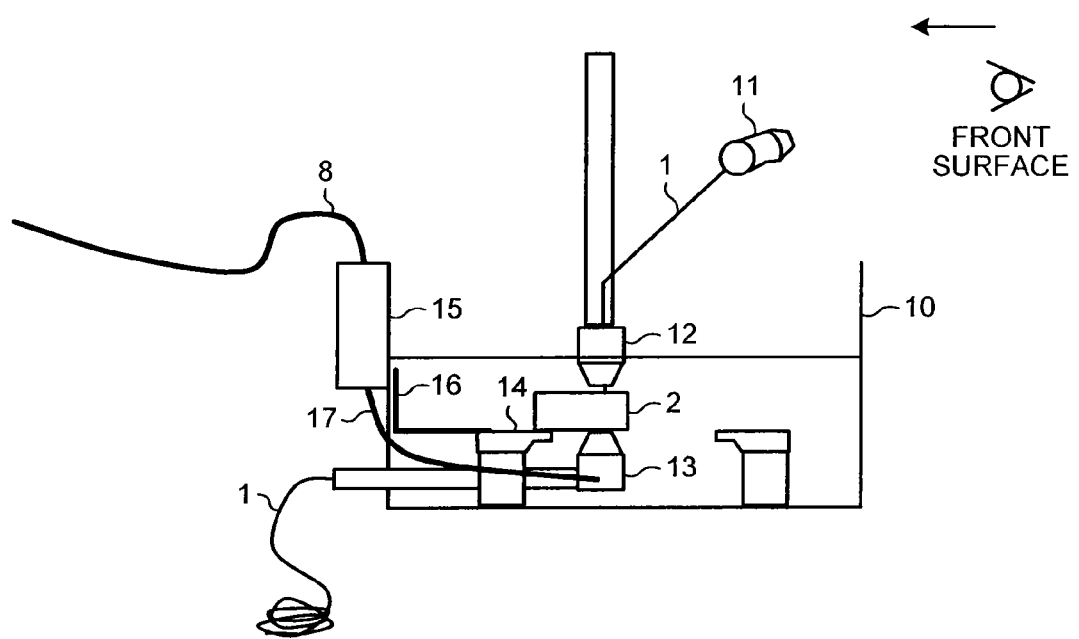
FIG. 2 is a conceptual diagram of an arrangement configuration example of an electric-discharge machining unit of an electric-discharge machining device.

FIG. 1 depicts a configuration using an electric-discharge machining device (a wire electric-discharge machining device) as a load. In FIG. 1, a machining electrode 1 and a workpiece 2 are arranged to be opposite to each other in an electric-discharge machining unit of the electric-discharge machining device (see FIG. 2). FIG. 2 is a conceptual diagram of an arrangement configuration example of the electric-discharge machining unit of the electric-discharge machining device (the arrangement configuration example is described later).

A high-frequency power source device 3a according to the first embodiment has a configuration in which a high frequency pulse is generated from a DC power source 5 by switching element groups 6a and 6b and a reactor 7, and the generated high frequency pulse is applied to an electrode gap between the machining electrode 1 and the workpiece 2 through a coaxial cable 8 and a matching circuit 9. Another cable such as a twisted wire can be used instead of the coaxial cable.

The switching element groups 6a and 6b are formed by connecting the same number of switching elements in parallel. One parallel connection terminal of the switching element group 6a is connected to a positive electrode terminal (+) of the DC power source 5, and one parallel connection terminal of the switching element group 6b is connected to a negative electrode terminal (−) of the DC power source 5. The reactor 7 is provided between the other parallel connection terminal of the switching element group 6a and the other parallel connection terminal of the switching element group 6b.

When the respective switching elements of the switching element groups 6a and 6b are turned on/off cyclically in the same order, a high-frequency pulse voltage with the other parallel connection terminal of the switching element group 6a being a positive electrode side and the other parallel connection terminal of the switching element group 6b being a negative electrode side (a ground side) is output between the other parallel connection terminal of the switching element group 6a and the other parallel connection terminal of the switching element group 6b, that is, at opposite ends of the reactor 7.

The high-frequency pulse voltage is supplied while being matched with an electrical state of the electrode gap between the machining electrode 1 as a load and the workpiece 2 in the matching circuit 9. However, the matching circuit 9 is preferably connected to the electrode gap near the machining electrode 1 and the workpiece 2 (see FIG. 2). Therefore, the other parallel connection terminals of the switching element groups 6a and 6b and the matching circuit 9 are respectively connected by the coaxial cable 8.

A central conductor of the coaxial cable 8 forms a route of a positive electrode line that connects the other parallel connection terminal (a positive electrode side) of the switching element group 6a to the machining electrode 1. An outer conductor of the coaxial cable 8 forms a route of a negative electrode line that connects the other parallel connection terminal (a negative electrode side) of the switching element group 6b to the workpiece 2.

The matching circuit 9 has a π-type configuration in FIG. 1. In the electric-discharge machining device, the electrical state of the electrode gap is a capacitive high impedance at the time of non-discharging, a resistive low impedance at the time of discharging, and a low-impedance resistance load at the time of short circuit, or an inductive low impedance when the inductance of wire becomes dominant. A matching circuit that can achieve matching with the load easily is the π-type. However, a configuration example of an L-type, an inverted L-type, and the like are generally known. A different point between these is only easiness of matching, and thus the configuration is not limited to the π-type.

The π-type matching circuit 9 includes a reactor 9a to be inserted in the positive electrode line and variable capacitors 9b and 9c connected between the positive electrode line and the negative electrode line at the opposite ends of the reactor 9a. A variable capacitor is used as the capacitor. However, when the capacity is determined, a capacitor in which a capacitance value is fixed can be used.

An arrangement configuration of the machining electrode 1 and the workpiece 2 is briefly explained below with reference to FIG. 2.

In FIG. 2, the machining electrode 1 and the workpiece 2 are accommodated in a work tank 10. The machining electrode 1 is supplied from a wire bobbin 11, and is discharged to outside of the work tank 10 through an upper wire guide 12 and a lower wire guide 13. The upper wire guide 12 and the lower wire guide 13 are provided to maintain a high straightness characteristic of the machining electrode 1. The upper wire guide 12 and the lower wire guide 13 respectively include a power feeding mechanism for supplying a voltage pulse supplied from the machining power source to the machining electrode 1. The workpiece 2 is fitted to a surface plate 14 that is made of a conductive material. Generally, the surface plate 14 is grounded to the earth. The work tank 10 has such a structure that the workpiece 2 can be immersed in machining fluid such as water or oil. A matching circuit box 15 that accommodates therein the matching circuit 9 is arranged on the rear surface side of the work tank 10 in FIG. 2, because waterproofing is easy with this configuration. If it is possible, from the viewpoint of arranging the matching circuit box 15 as close as possible, the matching circuit box 15 may be arranged inside of the lower wire guide 13 or on the bottom of the work tank 10.

The reactor 9a with one end being connected to the central conductor of the coaxial cable 8 and the variable capacitors 9b and 9c that connect the central conductor and the outer conductor of the coaxial cable 8 with each other at the opposite ends of the reactor 9a are arranged in the matching circuit box 15.

Connection between the matching circuit 9 on a side in which the reactor 9a is not arranged (an outer conductor side of the coaxial cable 8) and the workpiece 2 in the matching circuit 9 is realized by electrically connecting the outer conductor of the coaxial cable 8 to the surface plate 14 by using a copper plate 16. A low resistance material should be used as much as possible as the material of the copper plate 16. However, the same material as that of the surface plate 14 can be used. It is important to connect these face to face. With this configuration, wiring up to the electrode gap can be achieved in a low-impedance state.

On the other hand, connection between the matching circuit 9 on a side in which the reactor 9a is arranged (a central conductor side of the coaxial cable 8) and the machining electrode 1 is realized by connecting a cable 17 connected to the other end of the reactor 9a to the lower wire guide 13. A floating capacitance depending on a dielectric constant of the machining fluid is generated between the cable 17 and the earth. When the fluid level of the machining fluid fluctuates, the floating capacitance value also changes, and thus the floating capacitance tends to be electrically unstable (particularly with respect to a high frequency pulse). Power feeding is possible from either the upper wire guide 12 or the lower wire guide 13. However, because a mode in which power feeding is performed only to the lower wire guide 13 is adopted here, the floating capacitance hardly fluctuates due to the liquid level fluctuation described above. Furthermore, unlike the side of the workpiece 2, the method of performing surface connection by using a metal plate without any discretion is not preferable. This is because the influence of the floating capacitance increases as described above.

As the cable 17, a single-core or multi-core cable line is used. When it is preferred to decrease the inductance components, parallel connection using a plurality of cables 17 is used or a flat cable is used for the cable 17.

In FIG. 1, as in Patent Literature 1, in the switching element groups 6a and 6b, respective switching elements are turned on/off cyclically in the same order. When one switching element is turned on, energy is charged to the reactor 7. The charged energy is discharged to the electrode gap by turning off the switching element. Subsequently, the next parallel-connected switching element is turned on, and energy is charged to the reactor 7 again. At a moment when the switching element is turned off, energy is discharged to the electrode gap again. In this manner, by performing the switching operation sequentially, a waveform is synthesized as a whole, with the frequency of one switching element being reduced, thereby enabling to apply the energy as a high frequency pulse to the electrode gap.

However, in the switching element group 6a or 6b, there are at least some variations in the respective parallel-connected switching elements. Even if there is no variation in the switching elements, the wiring pattern is not always equivalent, and when high-speed switching is performed, the transmission characteristic of the generated pulse becomes different. That is, because an output pulse width is as narrow as, for example, 100 to 300 nanoseconds, the influence of the switching speed becomes dominant. Accordingly, if the matching circuit 9 is not provided, waveforms having a different frequency component are applied to the electrode gap via the coaxial cable 8. Therefore, reflection tends to occur at the connection terminal between the coaxial cable and the electrode gap, and the pulse waveform tends to be disturbed due to the generated reflection.

In this regard, in the inventions of Patent Literatures 2 and 3 that are constituted by a crystal oscillator, because a single frequency is used, even when reflection occurs, the pulse waveform itself is not disturbed. It can be considered that when reflection occurs, an output decreases. In this case, as an extreme example, when an output of a power source is increased without using any matching circuit, an equivalent waveform can be applied to an electrode gap. On the other hand, when the plurality of switching elements described in the first embodiment are used, the pulse waveform itself is disturbed and changed. This is because an output method of the pulse uses a back electromotive force to the reactor. This is because a transient phenomenon such as dI/dt is used for the output voltage, and changes due to a characteristic difference and the environment are substantially present. Therefore, even if the output of the power source is increased, only an unstable transient pulse having large reflection is generated. The machining characteristic is also unstable.

At this time, the matching circuit 9 functions as a certain type of filter. That is, the matching circuit 9 transmits a certain frequency component among different frequency components to the electrode gap. The matching circuit 9 transmits a frequency component having the same impedance as that of the coaxial cable 8, which is a transmission line, to the electrode gap as a load. Accordingly, the variation in the characteristic impedance held by the switching elements is lessened, and a pulse train having a stable waveform can be supplied to the electrode gap. As a result, according to the first embodiment, a stable machining characteristic in which short circuit or the like hardly occurs can be achieved.

Second Embodiment

Figure 3:
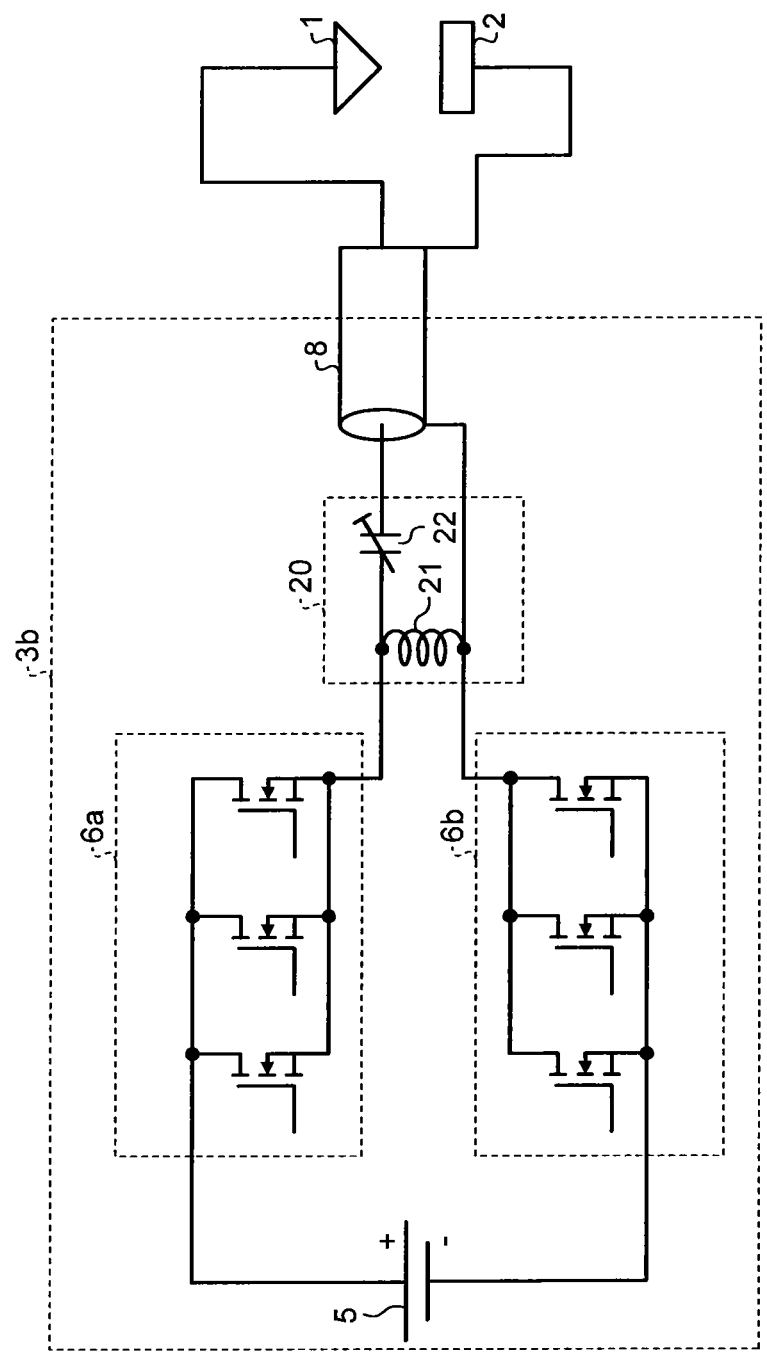
FIG. 3 is a circuit diagram of a configuration of a high-frequency power source device according to a second embodiment of the present invention.

FIG. 3 is a circuit diagram of a configuration of a high-frequency power source device according to a second embodiment of the present invention.

In FIG. 3, constituent elements identical or equivalent to those shown in FIG. 1 (the first embodiment) are denoted by like reference signs. Features relevant to the second embodiment are explained below.

As shown in FIG. 3, in a high-frequency power source device 3b according to the second embodiment, in the configuration shown in FIG. 1 (the first embodiment), the reactor 7 is omitted, a matching circuit 20 added with different reference numeral has an L-type configuration including a reactor 21 and a variable capacitor 22, and an output terminal of the matching circuit 20 is connected to a electrode gap via the coaxial cable 8.

In the matching circuit 20, the reactor 21 is provided between the other parallel connection terminal of the switching element group 6a and the other parallel connection terminal of the switching element group 6*b*. One end of the variable capacitor 22 is connected to an end of reactor 21 on the side of the machining electrode 1, and the other end is connected to the central conductor of the coaxial cable 8. Because the reactor 21 has the function of the reactor 7, a high frequency pulse can be supplied to the electrode gap as in the first embodiment.

The low frequency component is blocked by the variable capacitor 22, and only a high frequency component is applied to the electrode gap. That is, the variable capacitor 22 functions as a filter together with the reactor 21, and can operate to match the impedance with the electrode gap. In this manner, according to the second embodiment, the number of parts can be decreased, and a stable machining characteristic can be achieved with a simple configuration.

In the second embodiment, while the reactor 7 shown in FIG. 1 is omitted, the reactor 7 can be provided separately in parallel with the reactor 21. Furthermore, a reactor can be provided instead of the variable capacitor 22. Because optimum values are different depending on the impedance of the electrode gap as a load, the circuit configuration needs to be selected appropriately according to the state of the load.

Third Embodiment

Figure 4:
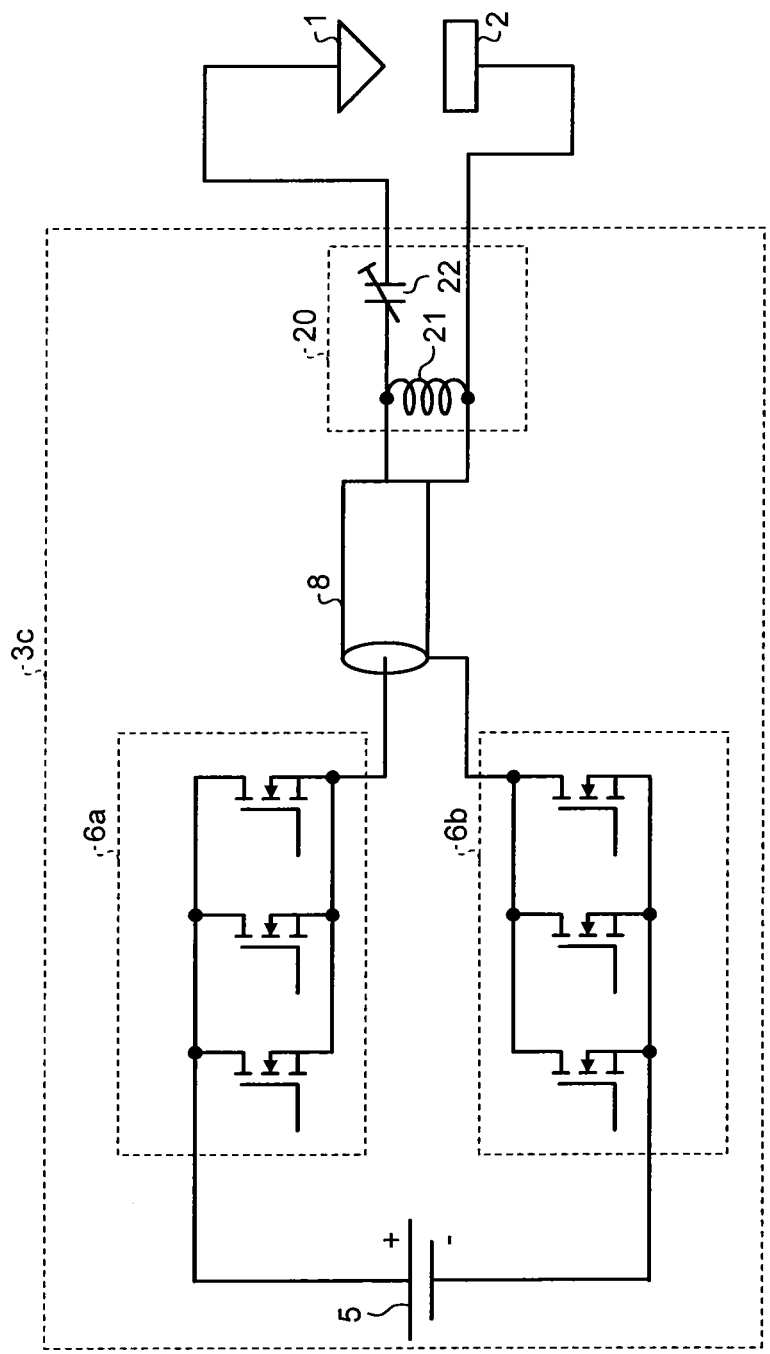
FIG. 4 is a circuit diagram of a configuration of a high-frequency power source device according to a third embodiment of the present invention.

FIG. 4 is a circuit diagram of a configuration of a high-frequency power source device according to a third embodiment of the present invention.

In FIG. 4, constituent elements identical or equivalent to those shown in FIG. 3 (the second embodiment) are denoted by like reference signs. Features relevant to the third embodiment are mainly explained below.

As shown in FIG. 4, in a high-frequency power source device 3*c* according to the third embodiment, in the configuration shown in FIG. 3 (the second embodiment), the positions of the coaxial cable 8 and the matching circuit 20 are reversed. Because it is preferred to form the matching circuit 20 near an electrode gap, the reactor 21 and the variable capacitor 22 are arranged near the electrode gap as in the first embodiment. With this configuration, energy accumulated in the reactor 21 via the switching element groups 6*a* and 6*b* can be discharged near the electrode gap. As shown in FIG. 2, the reactor 21 and the variable capacitor 22 can be accommodated in the matching circuit box 15 and connected to the rear surface of the work tank 10, and connection with the electrode gap can be the same as that in FIG. 2.

Energy accumulated in the reactor 21 is supplied to the electrode gap via the serially connected variable capacitor 22. By having the configuration as described in the third embodiment, a distribution constant of the coaxial cable 8 can be excluded with respect to the electrode gap. Therefore, the variable capacitor 22 can be adjusted more easily than that of the second embodiment.

In the third embodiment, while the reactor 21 is used, a transformer can be used instead of the reactor 21. An output impedance can be changed by using the transformer.

In this case, the influence of the characteristic impedance of the coaxial cable 8 needs to be eliminated. Therefore, in FIG. 4, it is preferred to insert the transformer at a subsequent stage of the coaxial cable 8 on the electrode gap side. The number of windings of the transformer is changed according to the impedance of the electrode gap to match the impedance, thereby enabling to output a highly stable pulse and to achieve a stable machining characteristic in which short circuit or the like hardly occurs.

Fourth Embodiment

Figure 5:
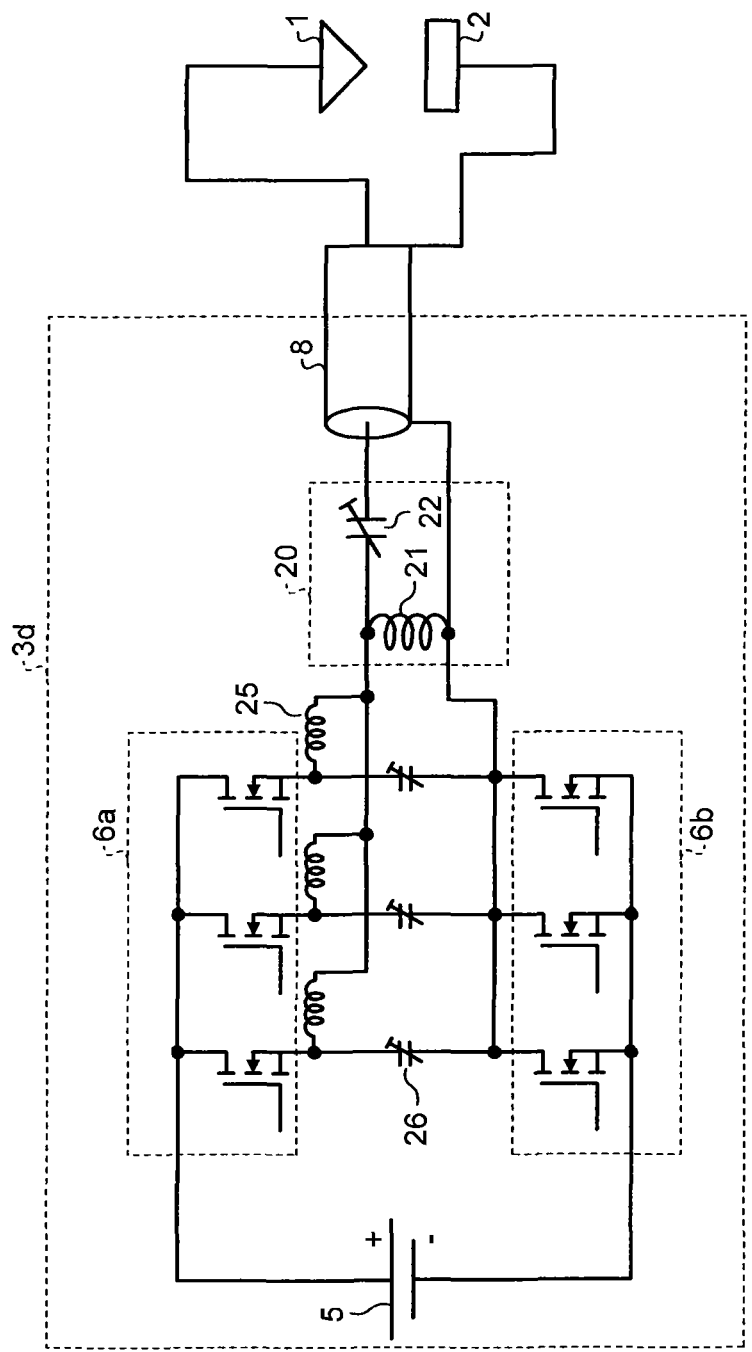
FIG. 5 is a circuit diagram of a configuration of a high-frequency power source device according to a fourth embodiment of the present invention.

FIG. 5 is a circuit diagram of a configuration of a high-frequency power source device according to a fourth embodiment of the present invention.

In FIG. 5, constituent elements identical or equivalent to those shown in FIG. 3 (the second embodiment) are denoted by like reference signs. In the present embodiment, features relevant to the fourth embodiment are mainly explained below. In the fourth embodiment, while an example of applying the high-frequency power source device to the second embodiment is described, the high-frequency power source device can be similarly applied to the first and third embodiments.

A variation is present in respective switching elements constituting the switching element group 6*a* and the switching element group 6*b*. Therefore, respective switching elements tend to output pulses having a different frequency component. Because a pulse output from the switching elements having a different characteristic from each other causes to accumulate energy in the reactor 7 or the reactor 21, which is a common element, a pulse train having a disturbed waveform is generated.

To handle this problem, the matching circuit 9 is provided in the first embodiment, and the matching circuit 20 is provided in the second and third embodiments to suppress a disturbed waveform of the high-frequency pulse train to be supplied to an electrode gap. In the fourth embodiment, as shown in FIG. 5, in the switching element group 6*a* or the switching element group 6*b*, which is a generation unit of the high frequency pulse, a reactor 25 and a variable capacitor 26 are inserted with respect to the respective switching elements so that pulses having a different frequency component are not output, thereby compensating a phase that directly accumulates energy in the reactor 7 or the reactor 21, which is a common element.

That is, in the first to third embodiments, parallel-connected switching elements are turned on/off cyclically to supply energy to a common inductance element, and when accumulated energy (a high frequency pulse) is applied to the electrode gap sequentially, the matching circuits 9 and 20 provided in the supply path shape a pulse having a different waveform for each switching element to apply the pulse having a similar waveform to the electrode gap. With this configuration, even if there is a variation in the switching elements, there is no fluctuation in a crest value, and even if the load fluctuates, there is less reflection. Therefore, a high-frequency power source device having a stable output characteristic can be achieved. In an electric-discharge machining device using the high-frequency power source device as a finish-machining power source, an electric-discharge machining characteristic that forms a stable fine machining surface can be achieved.

When the fourth embodiment in which a phase that accumulates energy in the reactor 7 or the reactor 21 as a common element is compensated is applied to the first to the third embodiments, the high-frequency power source device having a more stable output characteristic can be achieved, and the electrical discharge machining characteristic for forming a more stable fine machining surface can be achieved in the electric-discharge machining device using the high-frequency power source device as the finish-machining power source.

That is, as shown in FIG. 5, in a high-frequency power source device 3*d* according to the fourth embodiment, in the configuration shown in FIG. 3 (the second embodiment), the respective other terminals of the switching elements constituting the switching element group 6*a* are not directly connected to constitute the other parallel connection terminal, but are connected respectively via the reactor 25, to constitute the other parallel connection terminal. The respective other terminals of the switching elements constituting the switching element group 6a and the corresponding switching elements at the other parallel connection terminal of the switching element group 6b are connected by the variable capacitor 26.

The reactor 25 and the variable capacitor 26 are appropriately adjusted according to the characteristic of the switching element or a difference of a wiring route, so that roughly the same waveform can be applied to the reactor 21. With this configuration, even if there is a variation in the route, a stable pulse output can be obtained, and the machining characteristic can be stabilized. Needless to mention, as long as the capacitance value is determined, the variable capacitor 26 can be a fixed capacitor, or can be omitted if it is not required. That is, a configuration in which only the reactor 25 is connected can be used.

Particularly, as described in the third embodiment, when the reactor 21 and the variable capacitors 22 are arranged to be closer on the electrode gap side than the coaxial cable 8, a method of constituting a compensation circuit for each switching element as described in the fourth embodiment is effective. When a path to the reactor 21 is long, because the transmission path is long, unintended floating reactance and floating conductance are likely to be interposed. Therefore, reflection tends to occur in any position. Compensation of the waveform can be easily made by inserting a waveform compensation circuit near a generation unit where a disturbance occurs in the output waveform, rather than by inserting a matching circuit at a position away from the generation unit where a disturbance occurs in the output waveform.

As the load of the high-frequency power source generation device according to the present embodiment, a space between electrodes of the electric-discharge machining device is assumed. The load is in any one of a discharged state, an undischarged (open) state, or a short-circuited state, and is changed depending on a distance between electrodes. Furthermore, because the impedance is largely different from each other in the respective states, matching cannot be taken in all these states. That is, after matching is taken in the open or discharged state, even if the load fluctuates, the same matching constant is used. Because the short-circuited state does not contribute to the machining, even if reflection increases, the influence thereof is small.

However, in the electric-discharge machining device, not only the interelectrode phenomena but also the imminent environment intricately affect an electric constant, which needs to be taken into consideration. For example, an installation position of a workpiece on a surface plate is left to the user's discretion, and the thickness of the workpiece and a wire diameter to be used vary. However, when a machining position or the thickness of the workpiece changes, the impedance as viewed from the power source changes accordingly, and even if the space between electrodes is in the open state, the output waveform may slightly change. Accordingly, it is preferred that the matching constant is appropriately changed depending on the respective states.

In a general matching circuit, the capacity is changed in an analog manner by using a vacuum air variable capacitor. Specifically, a motor and a vacuum air variable capacitor are combined to change the capacity based on the number of rotations (a rotation rate). In the first to fourth embodiments, a matching circuit using the variable capacitor has been explained in this regard. However, the motor and the vacuum air variable capacitor have a problem in terms of reliability.

Fifth Embodiment

Figure 6:
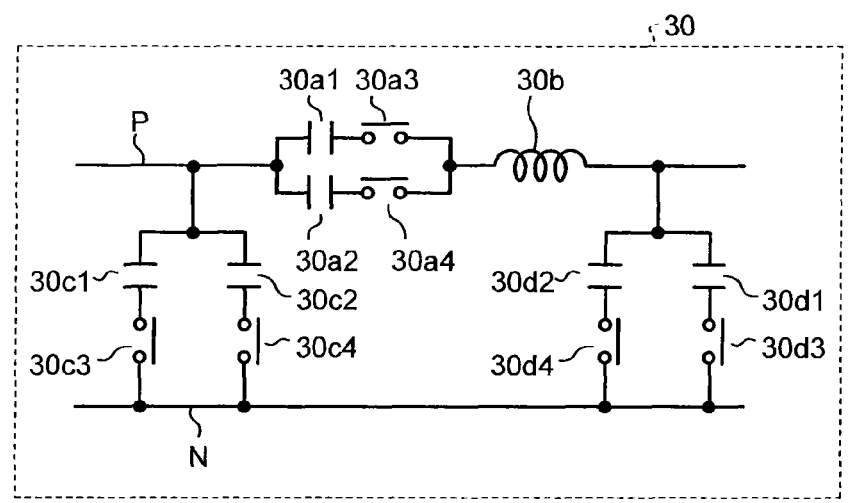
FIG. 6 is a circuit diagram of another configuration example of a matching circuit, as a fifth embodiment of the present invention.

Therefore, in a fifth embodiment, a matching circuit that can solve this problem is explained. This problem can be solved by constituting the matching circuit, for example, as shown in FIG. 6. FIG. 6 is a circuit diagram of another configuration example of a matching circuit, as the fifth embodiment of the present invention. FIG. 6 is an example of applying the configuration of the fifth embodiment to the π-type matching circuit shown in FIG. 1 (the first embodiment); however, the configuration can be similarly applied to the L-type matching circuit shown in FIGS. 3 to 5 (the second to fourth embodiments).

A π-type matching circuit 30 shown in FIG. 6 includes a series circuit of a fixed capacitor 30a1 and a switch 30a3 and a series circuit of a fixed capacitor 30a2 and a switch 30a4 connected in parallel at one end of a reactor 30b, arranged instead of the reactor 9a inserted in a positive electrode line P in the π-type matching circuit 9 shown in FIG. 1. Furthermore, of the two variable capacitors arranged between the positive electrode line P and a negative electrode line N, a series circuit of a fixed capacitor 30c1 and a switch 30c3 and a series circuit of a fixed capacitor 30c2 and a switch 30c4 are parallel-connected and arranged instead of the one variable capacitor 9b. A series circuit of a fixed capacitor 30d1 and a switch 30d3 and a series circuit of a fixed capacitor 30d2 and a switch 30d4 are parallel-connected and arranged instead of the other variable capacitor 9c.

The fixed capacitors 30c1, 30c2, 30a1, 30a2, 30d1, and 30d2 are made of a ceramic material, respectively. The switches 30c3, 30c4, 30a3, 30a4, 30d3, and 30d4 respectively indicate a relay element in FIG. 6; however, these can be a semiconductor switching element or a mechanical switch.

In the respective pairs of the parallel-connected fixed capacitors "30a1, 30a2", "30c1, 30c2", and "30d1, 30d2", a capacitance value is binary-weighted respectively, for example, one of the capacitance value is 1 nF and the other is 2 nF.

With this configuration, the capacitance value at a position where the series circuit of the fixed capacitor 30c1 and the switch 30c3 and the series circuit of the fixed capacitor 30c2 and the switch 30c4 are parallel-connected and arranged becomes 1 nF in a pattern in which one of the switches 30c3 and 30c4 is closed and the other is opened, becomes 1 nF in a pattern in which one of the switches 30c3 and 30c4 is opened and the other is closed, becomes 2 nF in a pattern in which one of the switches 30c3 and 30c4 is opened and the other is closed, and becomes 3 nF in a pattern in which both the switches 30c3 and 30c4 are closed, thereby enabling to form three types of capacitance values.

The same applies to a position where the series circuit of the fixed capacitor 30a1 and the switch 30a3 and the series circuit of the fixed capacitor 30a2 and the switch 30a4 are parallel-connected and arranged, and at a position where the series circuit of the fixed capacitor 30d1 and the switch 30d3 and the series circuit of the fixed capacitor 30d2 and the switch 30d4 are parallel-connected and arranged.

The pair of the fixed capacitors "30a1, 30a2" parallel-connected at one end of the reactor 30b is provided for compensation of the reactor 30b. Electrically, imaginary numbers negate each other by serially arranging the capacitor and the reactor, and thus the redundant impedance works effectively. That is, it can be considered that provision of the capacitor 30a1 or the capacitor 30a2 with respect to the reactor 30b means that a plurality of reactors are switched.

As described above, the matching circuit according to the fifth embodiment can control the matching constant in a digital manner by arranging in parallel a plurality of fixed capacitors with the capacitance value being binary-weighted and switching these fixed capacitors by a switch, thereby enabling to form a circuit configuration having high controllability. In addition, because the fixed capacitor has a relatively stable characteristic, a matching circuit having excellent reproducibility and high reliability can be obtained.

Sixth Embodiment

In a sixth embodiment, there is explained a method of obtaining an output waveform that is n times as large as an oscillation frequency of a switching element by using resonance between a power source circuit and a load in the high-frequency power source device described in the first to fifth embodiments.

Figure 7:
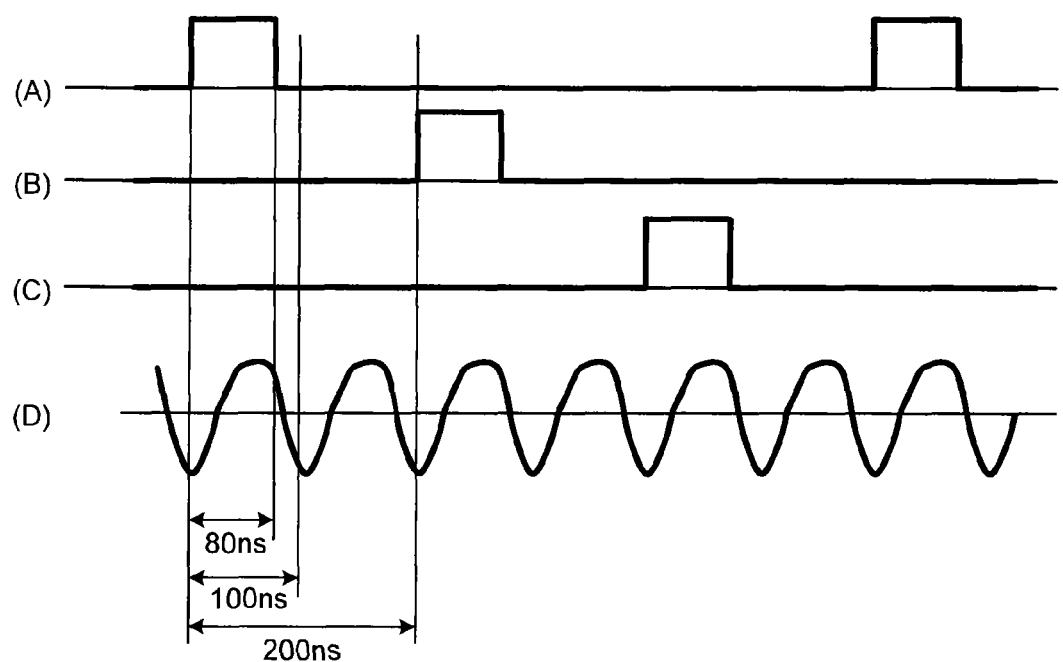
FIG. 7 is a waveform diagram for explaining a method of obtaining an output waveform that is n times as large as an oscillation frequency of a switching element, as a sixth embodiment of the present invention.

FIG. 7 is a waveform diagram for explaining the method of obtaining an output waveform that is n times as large as an oscillation frequency of a switching element, as the sixth embodiment of the present invention. In FIG. 7, waveforms (A) to (C) are control waveforms applied to gates of the switching element group 6a and the switching element group 6b. Three switching elements are arranged in parallel, and are cyclically operated as indicated by the waveforms (A) to (C). A waveform (D) is an example of an output waveform between electrodes.

The on-width for operating the switching element is 80 nanoseconds, and an interval between the on-timing of one switching element and the on-timing of the next switching element is 200 nanoseconds. That is, FIG. 7 is an example in which the switching element group 6a and the switching element group 6b oscillate at 5 megahertz.

For example, because the reactor 7 is provided in the high-frequency power source device 3a, when its load is capacitive, a resonant condition can be obtained. That is, a waveform resonating between the high-frequency power source device 3a and the floating capacitance between electrodes is the output waveform between electrodes indicated by the waveform (D).

The matching circuit 9 adjusts the matching constant so that matching between a power source and a load can be taken at the time of 10 megahertz. It means that only 10-MHz components can move between the power source and the load, and other frequency components are blocked. Accordingly, 10 megahertz is obtained as the waveform between electrodes.

The oscillation waveform and the output waveform shown in FIG. 7 are only an example, and the oscillation waveform can be set to 2 megahertz to obtain a 10-MHz output waveform with fivefold resonance. The output waveform that is n times as large as the oscillation frequency can be obtained by adjusting the matching circuit. In the electric-discharge machining device, when the output waveform to the space between electrodes has high frequency components, the surface roughness of machining can be improved. Therefore, a high output waveform is preferable in terms of machining.

In a case of the high-frequency AC power source as described in Patent Literature 2, the frequency of the oscillation waveform and that of the output waveform become the same. However, in a case of an output waveform having a frequency of ten-odd megahertz to several tens of megahertz, the high-frequency power source needs to have a configuration of a class A amplifier to a class C amplifier, and thus high power source efficiency cannot be obtained. Furthermore, the switching element to be used becomes an expensive switching element for RF. On the other hand, according to the sixth embodiment, because an output waveform having a higher frequency than an oscillation waveform can be obtained, a relatively inexpensive switching element can be used. Further, because the number of switching operations decreases, switching loss decreases, and high power source efficiency can be achieved.

Further, because the surface roughness depends on the frequency of the output waveform, in a finishing process in which the surface roughness is decreased at each stage, by controlling the matching constant, the switching frequency, and the switching pulse width, the output waveform can be switched, for example, to several megahertz, ten-odd megahertz, and several tens of megahertz. Accordingly, a simple and excellent machining performance can be achieved.

In the first to sixth embodiments, a circuit configuration in which a plurality of switching elements connected in parallel are cyclically driven is assumed. Because the on/off timing of these switching elements is arbitrary, a pulse width can be made different for each pulse, different from a high-frequency power source device using a crystal oscillator. For example, a switching element having a low switching speed has a narrow pulse width as compared to a switching element having a high switching speed. In other words, if the pulse is output by extending the pulse width beforehand for a slow switching element, the final pulse output waveform can be compensated.

Furthermore, the matching circuit used in the first to sixth embodiments is a certain type of filter, and is an element using resonance. When the matching circuit is oscillated intermittently, a part of the resonant waveform tends to be left immediately after starting the output or immediately after stopping the output. The resonant waveform may affect machining. Therefore, by changing the pulse waveform immediately after starting application or immediately after stopping application of a rectangular pulse from the waveform in a steady state, an intermittent oscillation operation suitable for machining can be performed.

In the first to sixth embodiments, a case where a wire electric-discharge machining device is used as a load has been described; however, the present invention is not limited thereto. It is needless to mention that various loads generated based on various viewpoints can be used. When the present invention is applied to a load using a high-frequency power source and changing non-linearly, such as an electric-discharge machining device, the present invention is effective to a circuit configuration in which oscillation of other than continuous pulses such as intermittent pulses is required.

In the first to sixth embodiments, two switching element groups 6a and 6b are used while corresponding to the positive electrode terminal and the negative electrode terminal of the DC power source 5. However, the similar function can be realized by using either one of the switching element groups 6a and 6b. However, by using the two switching element groups, a current cut-off speed can be increased, thereby enabling to increase dI/dt. Accordingly, a voltage pulse having less loss and a high peak can be applied to the space between electrodes.

INDUSTRIAL APPLICABILITY

As described above, the high-frequency power source device according to the present invention is useful as a high-frequency power source device that can obtain a stable voltage pulse output even when a load fluctuates when a plurality of switching elements are arranged in parallel and turned on/off cyclically, and is particularly suitable for forming a fine machining surface stably by applying a high-frequency power source device to a finish-machining power source of an electric-discharge machining device.

REFERENCE SIGNS LIST 1 machining electrode
2 workpiece
3a, 3b, 3c, 3d high-frequency power source device 5 DC power source
6a, 6b switching element group
7, 9a, 21, 25, 30b reactor
8 coaxial cable
9, 20, 30 matching circuit
9b, 9c, 22, 26 variable capacitor
15 matching circuit box
30a1, 30a2, 30c1, 30c2, 30d1, 30d2 fixed capacitor
30a3, 30a4, 30c3, 30c4, 30d3, 30d4 switch

The invention claimed is:

1. A high-frequency power source device comprising:
a DC power source;
two switching element groups connected in parallel, one parallel connection terminal of a first of the two switching element groups being connected to a positive terminal of the DC power source, one parallel connection terminal of a second of the two switching element groups being connected to a negative terminal of the DC power source, the switching element groups being turned on and off cyclically;
a first inductance element that is connected between another parallel connection terminal of the first switching element group and another parallel connection terminal of the second switching element group;
a second inductance element that is connected to a connection terminal between the switching element groups and the first inductance element, and is serially connected between the switching element groups and a load; and
a first capacitor that is connected in parallel with the load, wherein
an output frequency that is n times as large as an oscillation frequency of the switching element groups is supplied to the load, n being an integer equal to or larger than 2.

2. The high-frequency power source device according to claim 1, wherein a control pulse width of the switching element groups is varied for each switching element.

3. A high-frequency power source device comprising:
a DC power source;
two switching element groups connected in parallel, one parallel connection terminal of a first of the two switching element groups being connected to a positive terminal of the DC power source, one parallel connection terminal of a second of the two switching element groups being connected to a negative terminal of the DC power source, the switching element groups being turned on and off cyclically;
a first inductance element that is connected between another parallel connection terminal of the first switching element group and another parallel connection terminal of the second switching element group; and
a capacitor that is connected to a connection terminal between the switching element groups and the first inductance element, and is serially connected between the switching element groups and a load, wherein
an output frequency that is n times as large as an oscillation frequency of the switching element groups is supplied to the load, n being an integer equal to or larger than 2.

4. The high-frequency power source device according to claim 3, wherein a control pulse width of the switching element groups is varied for each switching element.

* * * * *